United States Patent [19]

Matsumoto et al.

[11] 4,396,703

[45] Aug. 2, 1983

[54] RETOUCHING AGENT FOR LITHOGRAPHIC PRINTING PLATE

[75] Inventors: Hiroshi Matsumoto; Shizuo Miyano, both of Shizuoka, Japan

[73] Assignee: Fuji Photo Film Co., Ltd., Kanagawa, Japan

[21] Appl. No.: 339,935

[22] Filed: Jan. 18, 1982

Related U.S. Application Data

[63] Continuation of Ser. No. 130,633, Mar. 14, 1980, abandoned.

[30] Foreign Application Priority Data

Mar. 15, 1979 [JP] Japan .................................. 54-30289

[51] Int. Cl.[3] .......................... B41N 3/00; G03F 7/08

[52] U.S. Cl. .................................... 430/302; 101/465; 430/309; 430/331; 430/432; 430/463; 430/347; 427/140

[58] Field of Search ............... 430/309, 302, 331, 432, 430/463, 347; 427/140; 101/465

[56] References Cited

U.S. PATENT DOCUMENTS 3,707,373 12/1972 Martinson et al. .................. 430/309

FOREIGN PATENT DOCUMENTS 1272868 5/1972 United Kingdom .
1408709 10/1975 United Kingdom .

*Primary Examiner*—Charles L. Bowers, Jr.
*Attorney, Agent, or Firm*—Sughrue, Mion, Zinn, Macpeak & Seas

[57] ABSTRACT

A retouching agent for lithographic printing plate containing an admixture of (a) a lactone having 4 to 6 carbon atoms and (b) a glycol ether or ketone.

11 Claims, No Drawings

RETOUCHING AGENT FOR LITHOGRAPHIC PRINTING PLATE

This is a Continuation, of application Ser. No. 130,633, filed Mar. 4, 1980, abandoned.

BACKGROUND OF THE INVENTION

1. Field of the Invention

This invention relates to a retouching agent for lithographic printing plate and, more particularly, to an agent that can be used to erase a portion of the image area of a lithographic printing plate prepared by a photochemical process or an area that repels the fountain solutions (or dampening water) used in lithographic printing and receives oily ink.

2. Description of the Prior Art

Japanese Patent Publication No. 33442/76 (corresponding to British Pat. No. 1,408,709) teaches a retouching agent that contains a lactone having 3 to 6 carbon atoms and which is applied to a lithographic printing plate prepared from a photosensitive material in which the photosensitive layer contains an o-quinonediazide compound (this plate being referred to as a presensitized plate and dubbed a PS plate in the art). Japanese Patent Publication No. 16047/71 (corresponding to British Pat. No. 1,272,868) teaches a correcting medium for a photomechanically prepared lithographic printing plate that contains:

(1) 20 to 60 wt% of glycol, polyglycol, glycol ether or polyglycol ether;
(2) 10 to 50 wt% of a neutral organic solvent other than those mentioned under (1);
(3) 3 to 25 wt% of water;
(4) 0.5 to 15 wt% of acid or a substance exhibiting acidity in an aqueous solution; and
(5) 5 to 25 wt% of a thickening agent, the liquids mentioned under (1), (2) and (3) being so selected and in such proportion that they are completely miscible.

Conventional retouching or correcting agents have the following defects. The vapors of the solvent used in the retouching agent disclosed in Japanese Patent Publication No. 33442/76 act on a portion of the image areas adjacent those to be corrected. The agent also has the disadvantage of slow erasing speed. The correcting medium described in Japanese Patent Publication No. 16047/71 requires the use of a fluorine-containing compound. This compound not only attacks a brush and like applicators used in applying the medium to a particular portion of the image area of the lithographic plate but it is also hazardous and presents pollution problems.

SUMMARY OF THE INVENTION

Therefore, one object of this invention is to provide a retouching agent for a lithographic printing plate which is capable of erasing only the desired portions of the image area without adversely affecting portions adjacent the image area.

Another object of this invention is to provide a retouching agent for a lithographic printing plate which permits rapid erasure of the desired portions of an image area.

A further object of this invention is to provide a retouching agent for a lithographic printing plate which can be used safely and without pollution problems.

As a result of various studies directed to achieving the above stated objects, it has been found that these objects can be met by a retouching agent containing an admixture of (a) a lactone having 4 to 6 carbon atoms and (b) a glycol ether or ketone. The retouching agent of this invention containing an admixture of the components (a) and (b) requires a shorter time to erase a desired portion of an image area than a retouching agent containing either component (a) or (b) alone, and, in addition, the retouching agent does not adversely affect necessary portions (not to be erased) adjacent the unwanted portions (to be erased) of the image area. It is surprising indeed that such advantages cannot be obtained by combining the lactone with organic solvents such as xylene.

DETAILED DESCRIPTION OF THE INVENTION

As defined above, the retouching agent of this invention consists of a composition containing an admixture of lactone and glycol ether or ketone. It is to be understood, however, that this agent can further contain (c) an organic solvent other than the lactone, glycol ether, or ketone, (d) an acidic compound, (e) a water-soluble high molecular weight material, (f) a surfactant, (g) water, (h), a coloring agent and/or (i) a viscosity-adjusting agent.

These essential and optional components of the composition of this invention are hereunder described in detail.

Examples of the component (a), or the lactone having 4 to 6 carbon atoms include butyrolactone, valerolactone and hexanolactone. γ-Butyrolactone, is preferred. These lactones can be used independently or as a mixture.

The glycol ethers used as component (b) preferably have a boiling point above about 120° C. to about 300° C. and the most preferably have a boiling point of about 140° to 250° C. Of course, they must be liquid at the temperatures at which they are used and in most cases the ethers illustrated below melt at temperatures below −8° C. and in almost all cases below 0° C. Representative examples include glycol monoalkyl ethers (e.g., having 1 to 4 carbon atoms in the alkyl moiety) such as 2-methoxyethanol, 2-ethoxyethanol, 2-isopropoxyethanol, and 2-butylglycol; glycol monoaryl ethers such as 2-phenyl ethanol; diglycol monoalkyl ethers (e.g., having 1 to 4 carbon atoms in the alkyl moiety) such as diethylene glycol monomethyl ether, diethylene glycol monoethyl ether, diethylene glycol monoisopropyl ether, diethylene glycol monobutyl ether, and diethylene glycol monoisobutyl ether; triglycol monoalkyl ethers (e.g., having 1 to 4 carbon atoms in the alkyl moiety) such as triethylene glycol monomethyl ether, triethylene glycol monoethyl ether, and triethylene glycol monobutyl ether; ethylene glycol dialkyl ethers (e.g., having 1 to 4 carbon atoms in the alkyl moiety) such as ethylene glycol dimethyl ether; and diethylene glycol dialkyl ethers (preferably having 1 to 3 carbon atoms in the alkyl moieties) such as diethylene glycol dimethyl ether and diethylene glycol diethyl ether.

The ketones which can be used as component (b) preferably have the same melting and boiling points as defined above. Representative examples include methyl butyl ketone, methyl isobutyl ketone, ethyl butyl ketone, butyrone, methyl amyl ketone, methyl hexyl ketone, valerone, mesityl oxide, diacetone alcohol, cyclohexanone, methylcyclohexanone, isophorone, acetylacetone and acetonylacetone. The compounds used as component (b) can be used independently or as a mixture, e.g., a mixture of a glycol ether and a ketone is also included.

Of the compounds used as component (b), those having a boiling point of at least 140° C. are preferred, and glycol ethers giving off little malodor are used with particular advantage.

The ratio of components (a) to (b) can be selected from a wide range of proportions. A suitable ratio as expressed by weight is from about 4:1 to 1:5, preferably from about 3:1 to 1:4, and more preferably from about 2:1 to 1:3. The sum of the two components is suitably from about 15 wt% to 100 wt%, preferably from 30 to 90 wt%, and more preferably from 45 to 75 wt%, based on the total weight of the retouching agent of this invention.

Examples of the organic solvent which may be used as the optional component (c) other than the components (a) and (b) include those having a boiling point in the range of about 120° to about 400° C., for example, toluene, xylene, turpentine oil, n-heptane, solvent naphtha, and hydrocarbon solvents, preferably, kerosene and mineral spirits which are petroleum fractions boiling at a temperature between about 120° and 250° C. These solvents can be used independently or as a mixture. The organic solvent as component (c) can be used in an amount of not more than about 20 wt%, preferably from 3 to 15 wt%, based on the total weight of the retouching agent of this invention. The organic solvent functions to dissolve the printing ink when the retouching agent is applied to the ink-coated printing plate. As such the solvent is preferably present in the compositions of the present invention.

The retouching agent of this invention exhibits its effect fully under acidic conditions, preferably at a pH of about 1 and 5, and more preferably of about 1 and 3. Since the lactone incorporated as component (a) in the retouching agent of this invention dissociates in an aqueous solution to exhibit acidity, an additional acidic substance (which includes not only substances generally referred to as acids but also those substances which exhibit acidity in an aqueous solution) hereunder referred to as component (d) need not necessarily be incorporated in the agent, except to obtain the preferred pH range indicated above. Preferred examples of acidic substances used as component (d) include mineral acids such as phosphoric acid, sulfuric acid and nitric acid, as well as organic acids such as citric acid, tannic acid, malic acid, glacial acetic acid, lactic acid, oxalic acid and p-toluenesulfonic acid. Phosphoric acid is particularly preferred, and it can be incorporated in the retouching agent of this invention in an amount of about 0.5 to about 20 wt%, more preferably about 2 to 10 wt%, based on the total weight of the agent.

The retouching agent of this invention can further contain a water-soluble high molecular weight material as component (e) to give it better characteristics, i.e., it spreads easily (flows well) when applied to a lithographic printing plate with a brush but not into necessary portions (not to be erased) of the image area. Preferred examples of the water-soluble high molecular weight material include polyvinyl pyrrolidone, methyl cellulose, polyvinyl methyl ether, vinyl methyl ether/maleic anhydride copolymer, polyethylene glycol, polypropylene glycol, vinyl acetate/maleic anhydride copolymer, and oxyethylene/oxypropylene block copolymer. Particularly preferred water-soluble high molecular weight materials are methyl cellulose, polyethylene glycol, polypropylene glycol and oxyethylene/oxypropylene block copolymer. These water-soluble high molecular weight materials can be used independently or as a mixture. They can be used in an amount of about 0.5 to 10 wt%, preferably about 1 to 5 wt%, based on the total weight of the retouching agent of this invention.

The retouching agent of this invention can optionally contain a surfactant as component (f). The component (f) enables other components of the retouching agent of this invention to adequately penetrate the image area of a lithographic plate to which it is applied and to form a stable solution as a result of their intimate mixing. Anionic and nonionic surfactants are used with advantage as component (f). Illustrative preferred anionic surfactants are salts of alkyl sulfate esters, alkyl benzene sulfonate salts, alkyl naphthalenesulfonate salts, salts of dialkyl sulfosuccinate esters, salts of alkyl phosphate esters, naphthalenesulfonic acid/formalin condensates; and salts of polyoxyethylene alkyl sulfate esters. Illustrative preferred nonionic surfactants are polyoxyethylene alkyl ethers, polyoxyethylene alkyl phenyl ethers, polyoxyethylene/aliphatic acid esters, sorbitan/aliphatic acid esters, polyoxyethylene sorbitan/aliphatic acid esters, glycerin/aliphatic acid esters, oxyethylene/oxypropylene block copolymers. Of these, surfactants having HLB of at least 8 exhibit high wetting property and are used with particular advantage. These surfactants can be used independently or as a mixture. They are suitably used in an amount of from about 0.5 to about 20 wt%, preferably from 3 to 15 wt%, based on the total weight of the retouching agent of this invention.

The retouching agent of this invention can and preferably does further contain water as component (g). Water promotes the dissolution of the water-soluble high molecular weight material used as component (e), enhances the activity of the acidic substance used as component (d), or is effective in forming a stable mixture of the other components. Water is used in an amount of about 0.5 to about 20 wt%, preferably about 1 to 10 wt%, based on the total weight of the retouching agent of this invention.

A coloring agent (h) is incorporated in the retouching agent of this invention to provide the agent with the desired color tone, hence visual contrast, and it can be selected from a wide range of dyes. Effective and also preferred dyes are indicator dyes that provide deep blue, violet and red colors. It is to be emphasized that these coloring agents are optional. When used, their amount is in the range of from about 0.001 to about 0.01 wt%, preferably from 0.004 to 0.008 wt%, based on the total weight of the retouching agent of this invention.

The retouching agent of this invention can further contain a viscosity-adjusting agent as component (i). The component (i) gives the retouching agent of this invention a thixotropic property for better writing quality and the resulting retouching agent will not fall in drops from a brush or like applicator with which it is applied to a desired portion of the image area of a lithographic printing plate. Part of the water-soluble high molecular weight material used as component (e) functions as component (i), but it is preferred to add a fine powder of silicic acid because of its desired performance as a viscosity-adjusting agent. Such silicic acid may be used in an amount of from 1 to 10 wt%, preferably from 3 to 6 wt%, based on the total weight of the retouching agent of this invention.

The retouching agent of this invention is used with particular advantage for erasing a portion of the image area of a lithographic printing plate prepared from a PS plate having disposed on the support a photosensitive layer containing an o-quinonediazide compound. Therefore, such PS plate will hereunder be described in detail.

Examples of the support for the PS plate include metal sheets such as aluminum (including aluminum alloys), zinc and copper, as well as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and other plastic films which are laminated or metallized with the above indicated metals. Of these supports, the aluminum sheet is particularly preferred because of its high dimensional stability and low price. Another preferred example is a composite sheet of the type described in Japanese Patent Publication No. 18327/73 which has a polyethylene terephthalate film combined with an aluminum sheet.

The support must have a hydrophilic surface. By the term "hydrophilic surface" as used herein is meant a surface that is wetted with dampening water and repels ink when the printing plate is placed on a lithographic printing machine for performing printing under standard conditions. Several methods are known to provide the support with such hydrophilic surface. Supports having the surface of a metal, especially aluminum, are preferably subjected to such surface treatments as graining, immersion in an aqueous solution of sodium silicate, potassium fluorozirconate or phosphate, and anodization. Instead, the aluminum sheet may be grained, followed by immersion in aqueous sodium silicate as described in U.S. Pat. No. 2,714,066 or it may be anodized, followed by immersion in aqueous alkali metal silicate as described in Japanese Patent Publication No. 5125/72. Either of the two aluminum sheets may be used in this invention with advantage. The above indicated anodization is carried out in an electrolyte composed of one or more aqueous or non-aqueous solutions of inorganic acids such as phosphoric acid, chromic acid, sulfuric acid and boric acid or organic acids such as oxalic acid and sulfamic acid or salts thereof, with an electric current applied through an aluminum anode.

Another effective surface treatment is electrodeposition of silicate as described in U.S. Pat. No. 3,658,662.

A support subjected to electrolytic graining as described in Japanese Patent Publication No. 27481/71, Japanese Patent Application (OPI) Nos. 58602/72 (the term "OPI" as used herein refers to a "published unexamined Japanese patent application") and 30503/77, followed by the above-described anodization is also used with advantage. The purposees of these surface treatments are not limited to rendering the surface of the support hydrophilic; they are also performed to prevent deleterious reaction with a photosensitive composition to be disposed on the support as well as to provide intimate contact with the photosensitive layer.

The photosensitive layer disposed on the hydrophilic surface of the support contains an o-quinonediazide compound, preferably an o-naphthoquinonediazide compound. Illustrative o-naphthoquinonediazide compounds are mentioned in U.S. Pat. Nos. 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709, 3,647,443, and many other prior art references. These compounds can be used in this invention with advantage. Preferred examples are an o-naphthoquinonediazide sulfonate ester or an o-naphthoquinonediazide carboxylate ester of an aromatic hydroxyl compound, and an o-naphthoquinonediazide sulfonic acid amide or an o-naphthoquinonediazide carboxylic acid amide of an aromatic amino compound. Particularly preferred are a pyrogallol/acetone condensate which is esterified with o-naphthoquinonediazide sulfonic acid as described in U.S. Pat. No. 3,635,709; a polyester having a terminal hydroxyl group which is esterified with o-naphthoquinonediazide sulfonic acid or o-naphthoquinonediazide carboxylic acid as described in U.S. Pat. No. 4,028,111; a homopolymer of p-hydroxystyrene or a copolymer thereof with another copolymerizable monomer, which is esterified with o-naphthoquinonediazide sulfonic acid or o-naphthoquinonediazide carboxylic acid, as described in British Pat. No. 1,494,043; and a copolymer of p-aminostyrene and another copolymerizable monomer which is subjected to amide-forming reaction with o-naphthoquinonediazide sulfonic acid or o-naphthoquinonediazide carboxylic acid as described in U.S. Pat. No. 3,759,711.

These o-quinonediazide compounds may of course be used independently, but they are preferably mixed with an alkali-soluble resin and the resulting admixture may be disposed as a photosensitive layer. Advantageous alkali-soluble resins include phenolic novolak resins, for example, phenol-formaldehyde resin, o-cresol-formaldehyde resin and m-cresol-formaldehyde resin. More preferably, these phenolic resins may be used in combination with a condensate of alkyl ($C_{3-8}$)-substituted phenol or cresol and aldehyde (e.g., t-butyphenol-formaldehyde resin), as taught in U.S. Pat. No. 4,123,279. Such alkali-soluble resin is incorporated in the photosensitive layer in an amount of from about 50 to about 85 wt%, preferably from 60 to 80 wt%.

The photosensitive layer containing an o-quinonediazide compound may further contain a dye, plasticizer and other additives such as a component providing printing-out property.

The dye is used to give a contrast between the image area and the non-image area (the surface of the support) after imagewise exposure and development of a PS plate. Illustrative preferred dyes are alcohol-soluble dyes such as C.I. 26,105 (Oil Red RR), C.I. 21,260 (Oil Scarlet #308), C.I. 74,350 (Oil Blue), C.I. 52,015 (Methylene Blue) and C.I. 42,555 (Crystal Violet). The amount is such that it is sufficient to give a clear contrast between the color of the hydrophilic surface of the support which becomes exposed as a result of imagewise exposure and development of the photosensitive printing plate and the color of the area where the photosensitive layer remains intact; generally, the dye is used in an amount of not more than about 7 wt% of the total weight of the photosensitive composition.

The plasticizer is effective in providing a desired degree of flexibility for the photosensitive layer disposed on the support. Examples of the effective plasticizer are phthalate esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, and diaryl phthalate; glycol esters such as dimethyl glycol phthalate, ethyl phthalyl ethyl glycolate, methyl phthalyl ethyl glycolate, butyl phthalyl butyl glycolate, and triethylene glycol dicaprylate; phosphate esters such as tricresyl phosphate and triphenyl phosphate; aliphatic dibasic acid esters such as diisobutyl adipate, dioctyl adiphate, dimethyl sebacate, dibutyl sebacate, dioctyl azelate and dibutyl maleate; and polyglycidyl methacrylate, triethyl citrate, glycerin triacetate and butyl laurate. The plasticizer is incorporated in the photosensitive composition in an amount of not more than about 5 wt% of the total weight of the composition.

A print-out material is used to provide a visible image which is observable after imagewise exposure of the photosensitive layer of a PS plate. Examples of such print-out material are a pH indicator of the type described in British Pat. No. 1,041,463; the combination of o-naphthoquinonediazide-4-sulfonyl chloride and dye, as described in U.S. Pat. No. 3,969,118; and a photochromic compound of the type described in Japanese Patent Publication No. 6413/69. The sensitivity of the photosensitive layer can also be increased by adding a cyclic acid anhydride as described in U.S. Pat. No. 4,115,128.

The photosensitive layer described above that contains an o-quinonediazide compound is applied onto the support from a solution in a suitable solvent. Examples of the suitable solvent include glycol ethers such as ethylene glycol monomethyl ether, ethylene glycol monoethyl ether and 2-methoxyethyl acetate; ketones such as acetone, methyl ethyl ketone and cyclohexanone; and chlorinated hydrocarbons such as ethylene dichloride. The photosensitive layer containing an o-quinonediazide compound is typically applied to the support in a coating weight of from about 0.5 to about 7 $g/m^2$, preferably from 1.5 to 3 $g/m^2$.

The PS plate thus prepared is placed under a transparent original and imagewise exposed to a light source rich in actinic radiation such as a carbon arc lamp, a mercury lamp, a metal halide lamp, a xenon lamp, or a tungsten lamp, and the exposed area turns alkali-soluble. Hence, the exposed area is treated with aqueous alkali to dissolve it such that the hydrophilic surface of the support is exposed.

A preferred aqueous alkali solution for use as a developer contains a silicate in solution. Preferred silicates are those which exhibit alkalinity when dissolved in water, for example, alkali metal silicates such as sodium silicate, potassium silicate and sodium metasilicate; and ammonium silicate. The silicate is contained in a developer generally in an amount of from about 1 to about 10 wt%, preferably from 1 to 8 wt%, and more preferably from 2 to 6 wt%, based on the total weight of the developer. All that is required for the developer is that it be alkaline, and preferably it has a pH of from about 10.5 to about 13.5 at 25° C.

The developer may further contain an organic solvent in an amount of not more than 5 wt% of the total weight of the developer. Examples of such organic solvent include benzyl alcohol, 2-butoxyethanol, triethanolamine, diethanolamine, monoethanolamine, glycerin, ethylene glycol, polyethylene glycol and polypropylene glycol. The developer may further contain a surfactant, preferably an anionic surfactant or amphoteric surfactant.

If the image area of the lithographic printing plate prepared by imagewise exposing and developing the PS plate has an unwanted portion, this portion can be erased by applying the retouching agent of this invention. The retouching agent of this invention is preferably applied to the unwanted portion after thorough washing of the developed lithographic printing plate rather than right after the development. A general method for application of the retouching agent of this invention is to soak a paint brush in the agent and apply the brush to the portion of the image area that needs to be erased. The applied retouching agent is allowed to stand for a period of about 10 seconds to about 1 minute, and washed off with water. This permits the treated portion of the image area to be erased clean and the portion turns into a non-image area. Then, the printing plate is subjected to a conventional after-treatment (such as gumming) before it is subsequently used in lithographic printing.

The retouching agent of this invention can erase a desired portion of the image area at a very fast rate. Therefore, it has the advantage of shortened erasure process, hence, efficient photochemical process.

The retouching agent of this invention also has the advantage of erasing a desired portion of the image area without adversely affecting adjacent portions of the image area. Therefore, it can easily erase exactly the unwanted portions in a congested image area.

The retouching agent of this invention does not contain toxic substances such as a fluorine-containing compound. Therefore, it is least likely to be deleterious to public health in general and the health of the personnel than handle it in particular.

The retouching agent of this invention is hereunder described in greater detail by reference to the following examples, wherein all parts and percents are by weight.

EXAMPLE 1

Both surfaces of a 3S18H aluminum plate were sandblasted with powdered aluminum oxide of 250 mesh size (marketed under the trademark Alundum by the Norton Company), and immersed for 60 seconds in a 2% aqueous sodium secondary phosphate solution heated to 70° C. After washing with water, the plate was immersed in 70% aqueous nitric acid for 60 seconds and again washed with water. Subsequently, the plate was immersed for 120 seconds in a bath of a 2% aqueous solution of JIS No. 3 sodium silicate heated to 80° to 85° C., thereby to form a hydrophilic layer on the surface of the aluminum plate. After washing with water and drying, a sensitizing solution containing 5 parts of an o-naphthoquinonediazide compound (synthesized according to the method described in Example 1 of U.S. Pat. No. 3,635,709). 10 parts of an oil-soluble phenolic novolak resin and 0.8 part of a dye (C.I. 74,350) dissolved in a solvent mixture of 100 parts of methyl ethyl ketone and 80 parts of cyclohexanone was applied to the hydrophilic layer of the aluminum plate with a whirler, and the resulting coating was dried. The dry weight of the coated layer was 1.5 $g/m^2$.

The thus-formed photosensitive lithographic printing plate was imagewise exposed for 70 seconds through a positive film to a metal halide lamp (2 kw) positioned 70 cm away from the plate. The plate was then immersed in a 5% aqueous solution of sodium silicate ($SiO_2/Na_2O=1.74$) to dissolve and remove the exposed area. After development, the plate was washed with water and dried. The thus-prepared lithographic printing plate had the cut end of the positive film left as a faint image on the surface of the plate.

The retouching agent of this invention was prepared in the following manner. First, a mixture of 1.5 parts of hydroxypropyl methyl cellulose (methoxy group: 28–30%, hydroxypropoxy group: 7–12%, a viscosity of 2% aqueous solution at 20° C.: 40–60 cps) and 5.0 parts of an oxyethylene/oxypropylene block copolymer (composed of ethylene oxide block-copolymerized to both ends of the chain of polypropylene glycol having an average molecular weight of 2,000; the copolymer had a molecular weight of 10,000 and the ethylene oxide content was 80%) was dispersed in 50.0 parts of γ-butyrolactone. 10 parts of pure water was added to the dispersion to dissolve the solute, followed by addition of a mixture of 22 parts of 2-methoxyethanol, 0.5 part of sodium alkylbenzenesulfonate, 7 parts of phosphoric acid (85%) and 0.003 part of Crystal Violet under thorough agitation to form a homogeneous solution. In the solution, 4.0 parts of powdered silicon dioxide was dispersed. The resulting viscous retouching agent had a pH of 1.46 at 25° C.

A paint brush was soaked in the thus-prepared retouching agent, which was then applied to the area where the cut end of the film remained as an image on the lithographic printing plate. 30 minutes later, the agent was washed off with water by means of a spray. The hydrophilic layer became entirely exposed in the erased area which could not be distinguished from other portions of the non-image area.

The thus-retouched plate was gummed with a 14° Be aqueous solution of gum arabic, and placed on an offset printing machine to print 10,000 reproductions. All reproductions were beautiful having no stain in the erased area. The spreading of the retouching agent of this invention was minimum and, therefore, it could be used freely to retouch a congested area. In addition, there was safety in physiological aspects, and application of the agent in no way gave an uncomfortable result.

EXAMPLE 2

The procedure of Example 1 was repeated in Examples 2 thru 9 to prepare retouching agents from the formulations indicated in the respective Examples. Erasure with the resulting retouching agents in the manner described in Example 1 produced equally good results.

| | parts |
|---|---|
| γ-Butyrolactone | 50.0 |
| 2-Methoxyethanol | 22.0 |
| Phosphoric Acid (85%) | 7.0 |
| Vinyl Methyl Ether/Maleic Anhydride (1:1 by mol ratio) copolymer (intrinsic viscosity of 2.6–3.5 as solution of 1 g of copolymer in 100 g of methyl ethyl ketone at 25° C.) | 1.5 |
| Sodium Alkylbenzenesulfonate | 0.5 |
| Oxyethylene/Oxypropylene Block Copolymer (the same as used in Ex. 1) | 5.0 |
| Pure Water | 10.0 |
| Crystal Violet | 0.003 |
| Powdered Silicon Dioxide | 4.0 |

The resulting retouching agent had a pH of 1.55 at 25° C.

EXAMPLE 3

| | parts |
|---|---|
| γ-Butyrolactone | 48.8 |
| Cyclohexanone | 15.0 |
| Xylene | 7.0 |
| Phosphoric Acid (85%) | 5.0 |
| Methyl Cellulose (methoxy group: 27–32%, a viscosity of 550–750 cps as 2% aqueous solution at 20° C.) | 2.0 |
| Oxyethylene/Oxypropylene Block Polymer (the same as used in Ex. 1) | 6.0 |
| Sodium Lauryl Alcohol Sulfate | 0.2 |
| Water | 11.2 |
| Dye (C.I. Basic Red 2, 50240) | 0.005 |
| Powdered Silicon Dioxide | 5.0 |

The resulting retouching agent had a pH of 1.71 at 25° C.

EXAMPLE 4

| | parts |
|---|---|
| δ-Valerolactone | 29.5 |
| Ethylene Glycol Dimethyl Ether | 30.0 |
| Petroleum Fraction (b.p. 160–180° C., including alkylbenzenes of $C_{8-11}$) | 10.0 |
| Phosphoric Acid (85%) | 5.0 |
| Oxyethylene/Oxypropylene Block Polymer (HLB: 12) | 10.0 |
| Hydroxypropylmethyl Cellulose (the same as used in Ex. 1) | 1.5 |
| Pure Water | 9.0 |
| Dye (C.I. Basic Red 2, 50240) | 0.005 |
| Powdered Silicon Dioxide | 5.0 |

The resulting retouching agent had a pH of 1.78 at 25° C.

EXAMPLE 5

| | parts |
|---|---|
| γ-Butyrolactone | 25.0 |
| δ-Valerolactone | 16.0 |
| Ethylene Glycol Diethyl Ether | 21.0 |
| Xylene | 8.0 |
| Phosphoric Acid (85%) | 4.0 |
| Acetic Acid | 1.0 |
| Hydroxypropyl Methyl Cellulose (the same as used in Ex. 1) | 2.0 |
| Oxyethylene/Oxypropylene Block Polymer (HLB: 12) | 7.0 |
| Polyoxyethylene Oleyl Ether (HLB: 16.2) | 1.0 |
| Pure Water | 10.0 |
| Powdered Silicon Dioxide | 5.0 |

The resulting retouching agent had a pH of 1.03 at 25° C.

EXAMPLE 6

| | parts |
|---|---|
| γ-Butyrolactone | 41.0 |
| Cyclohexanone | 21.0 |
| Toluene | 5.0 |
| Xylene | 5.0 |
| Phosphoric Acid (85%) | 2.5 |
| Formic Acid | 1.5 |
| Hydroxypropyl Methyl Cellulose (the same as used in Ex. 3) | 2.0 |
| Oxyethylene/Oxypropylene Block Polymer (the same as used in Ex. 1) | 4.0 |
| Oxyethylene/Oxypropylene Block Polymer (HLB: 16) | 4.0 |
| Pure Water | 9.0 |
| Dye (C.I. Basic Blue 9, 52015) | 0.007 |
| Powdered Silicon Dioxide | 5.0 |

The resulting retouching agent had a pH of 1.72 at 25° C.

EXAMPLE 7

| | parts |
|---|---|
| γ-Butyrolactone | 32.3 |
| Diethylene Glycol Dimethyl Ether | 24.0 |
| Xylene | 13.7 |
| Phosphoric Acid (85%) | 3.0 |
| Sulfuric Acid (96%) | 1.0 |
| Oxyethylene/Oxypropylene Block Polymer (the same as used in Ex. 1) | 5.0 |
| Oxyethylene/Oxypropylene Block Polymer (HLB: 16.5) | 5.0 |
| Pure Water | 11.0 |
| Dye (C.I. Basic Red 2, 50240) | 0.005 |
| Powdered Silicon Dioxide | 5.0 |

The resulting retouching agent had a pH of 1.38 at 25° C.

EXAMPLE 8

| | parts |
|---|---|
| γ-Butyrolactone | 38.0 |
| Diethylene Glycol Diethyl Ether | 20.0 |
| Methyl Isobutyl Ketone | 6.0 |
| Xylene | 10.0 |
| Sodium Polyoxyethylene Alkyl Phenyl Ether Sulfate | 5.0 |
| Oxyethylene/Oxypropylene Block Polymer (the same as used in Ex. 1) | 6.0 |
| Phosphoric Acid (85%) | 4.0 |
| p-Toluenesulfonic Acid | 0.5 |
| Pure Water | 10.0 |
| Crystal Violet | 0.004 |
| Powdered Silicon Dioxide | 5.0 |

The resulting retouching agent had a pH of 1.42 at 25° C.

EXAMPLE 9

| | parts |
|---|---|
| γ-Butyrolactone | 30.0 |
| Ethylene Glycol Dimethyl Ether | 23.0 |
| Cyclohexanone | 10.0 |
| Petroleum Fraction (the same as used in Ex. 4) | 10.0 |
| Polyoxyethylene Nonyl Phenyl Ether (HLB: 7.8) | 1.0 |
| Polyvinyl Pyrrolidone K-30 | 1.5 |
| Oxyethylene/Oxypropylene Block Polymer (HLB: 15.5) | 8.0 |
| Phosphoric Acid (85%) | 3.0 |
| Citric Acid | 0.5 |
| Pure Water | 8.0 |
| Dye (C.I. Basic Red 2, 50240) | 0.005 |
| Powdered Silicon Dioxide | 5.0 |

The resulting retouching agent had a pH of 1.47 at 25° C.

EXAMPLES 10 AND 11 AND COMPARATIVE EXAMPLES 1 TO 8

The procedure of Example 1 was repeated to prepare retouching agents of the following formulations.

| | | parts |
|---|---|---|
| Solvent (a) Solvent (b) | See Table 1 below. | 70.0 |

-continued

| | parts |
|---|---|
| Pure Water | 10.0 |
| Hydroxypropyl Methyl Cellulose (the same as used in Ex. 1) | 3.0 |
| Phosphoric Acid (85%) | 3.0 |
| Oxyethylene/Oxypropylene Block Polymer (the same as used in Ex. 1) | 8.0 |
| Powdered Silicon Dioxide | 6.0 |

TABLE 1

| Run No. | Solvent (a) | (parts) | Solvent (b) | (parts) |
|---|---|---|---|---|
| Example 10 | γ-Butyrolactone | (45) | Diethylene Glycol Monomethyl Ether | (25) |
| Example 11 | γ-Butyrolactone | (45) | Cyclohexanone | (25) |
| Comparative Example 1 | γ-Butyrolactone | (45) | Dimethylformamide | (25) |
| Comparative Example 2 | γ-Butyrolactone | (45) | Xylene | (25) |
| Comparative Example 3 | γ-Butyrolactone | (45) | Solvent Naphtha | (25) |
| Comparative Example 4 | γ-Butyrolactone | (70) | — | — |
| Comparative Example 5 | — | — | Diethylene Glycol Monomethyl Ether | (70) |
| Comparative Example 6 | Xylene | (25) | Diethylene Glycol Monomethyl Ether | (45) |
| Comparative Example 7 | Cyclohexanone | (45) | Diethylene Glycol Monomethyl Ether | (25) |
| Comparative Example 8 | — | — | Cyclohexanone | (70) |

Each of the retouching agents prepared in Examples 10 and 11 as well as Comparative Examples 1 thru 8 was applied to erase an unwanted portion of the image area of a lithographic printing plate prepared in the manner described in Example 1. The time to erase and the sharpness (absence of spreading) of the boundary between the erased area and the area not to be erased were checked. The retouched plate was treated in the manner described in Example 1 and placed in a printing machine to print a predetermined number of reproductions. The reproductions were checked for any stain in the erased area. The results of these checkings are set forth in Table 2 below.

TABLE 2

| Run No. | Time to Erase (sec) | Sharpness | Stain |
|---|---|---|---|
| Example 10 | 20-30 | o | o |
| Example 11 | 30 | o | o |
| Comparative Example 1 | 20 | x | Δ |
| Comparative Example 2 | 30 | o | Δ-o |
| Comparative Example 3 | 30-40 | o | Δ-o |
| Comparative Example 4 | 40 | o | o |
| Comparative Example 5 | 40 | o | Δ |
| Comparative Example 6 | 30-40 | o | Δ |
| Comparative Example 7 | 40 | Δ-o | Δ |
| Comparative Example 8 | 60 | Δ | Δ |

The symbols noted in Table 2 for evaluation of "sharpness" and "stain" represent the following:
o: good sharpness or stain absent
Δ-o: fair sharpness or acceptable stain
Δ: poor sharpness or much stain
x: very poor sharpness or excessive stain The data in Table 2 demonstrates that good performance is exhibited only by the retouching agents containing the combination of lactone and glycol ether as well as the combination of lactone and ketone.

While the invention has been described in detail and with reference to specific embodiments thereof, it will be apparent to one skilled in the art that various changes and modifications can be made therein without departing from the spirit and scope thereof.

What is claimed is:

1. A process for retouching a lithographic printing plate which comprises applying to unwanted image area comprised of an imaged and developed o-quinonediazide compound, a retouching agent consisting essentially of (a) a lactone having 4 to 6 carbon atoms, (b) a glycol ether or a ketone, (d) an acidic substance to maintain a pH of about 1 to 5, (e) a water-soluble polymeric material, (f) a surfactant, (g) water, (i) and a viscosity-adjusting agent, having a pH of about 1 to 5, said glycol ether being selected from the group consisting of glycol monoalkyl ethers, diglycol monoalkyl ethers, triglycol monoalkyl ethers, ethylene glycol dialkyl ethers, and diethylene glycol dialkyl ethers, said ketone being selected from the group consisting of methyl butyl ketone, methyl isobutyl ketone, ethyl butyl ketone, butyrone, methyl amyl ketone, methyl hexyl ketone, valerone, mesityl oxide, diacetone alcohol, cyclohexanone, methylcyclohexanone, isophorone, acetylacetone and acetonylacetone, and the weight ratio of said component (a) to said component (b) being 2:1 to 1:3.

2. The process of claim 1, wherein said lactone is selected from the group consisting of butyrolactone, valerolactone, and hexanolactone.

3. The process of claim 2, wherein said lactone is γ-butyrolactone.

4. The process of claim 1, wherein component (b) has a boiling point of at least 140° C.

5. The process of claim 1 which additionally comprises an organic solvent.

6. The process of claim 5, wherein said solvent is selected from the group consisting of toluene, xylene, turpentine oil, n-heptane, solvent naphtha, and petroleum fractions boiling at temperatures of about 120° to 250° C.

7. The process of claim 1, wherein components (a) and (b) are present in a combined amount of about 15 to 100 wt% based on the total weight of the composition.

8. The process of claim 1, wherein said agent additionally comprises an acidic substance (b) whereby its pH is adjusted to about 1 to 3.

9. The process of claim 1, wherein said water-soluble polymeric material is selected from the group consisting of polyvinyl pyrrolidone, methyl cellulose, polyvinyl methyl ether, vinyl methyl ether/maleic anhydride copolymer, polyethylene glycol, polypropylene glycol, vinyl acetate/maleic anhydride copolymer and oxyethylene/oxypropylene block copolymer.

10. The process of claim 1, wherein said surfactant is an anionic or nonionic surfactant.

11. The process of claim 1 which additionally contains a coloring agent (h).

* * * * *